(12) United States Patent
Hwang

(10) Patent No.: US 7,709,871 B2
(45) Date of Patent: May 4, 2010

(54) CMOS IMAGE SENSOR AND METHOD FOR MANUFACTURING THE SAME

(75) Inventor: Joon Hwang, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/347,028

(22) Filed: Dec. 31, 2008

(65) Prior Publication Data

US 2009/0101946 A1 Apr. 23, 2009

Related U.S. Application Data

(62) Division of application No. 11/528,077, filed on Sep. 26, 2006, now Pat. No. 7,488,616.

(30) Foreign Application Priority Data

Sep. 28, 2005 (KR) .................. 10-2005-0090265

(51) Int. Cl.
*H01L 31/062* (2006.01)

(52) U.S. Cl. ............... 257/292; 257/294; 257/436; 257/461

(58) Field of Classification Search .......... 257/290, 257/291, 292, 293, 294, 431, 432, 435, 436, 257/461, 462
See application file for complete search history.

(56) References Cited

U.S. PATENT DOCUMENTS

| 5,631,753 | A | 5/1997 | Hamaguchi et al. |
| 6,251,700 | B1 | 6/2001 | Lin et al. |
| 6,507,083 | B1 * | 1/2003 | Tian ........................... 257/432 |
| 7,084,056 | B2 * | 8/2006 | Won ........................... 438/627 |
| 7,235,833 | B2 | 6/2007 | Chen |
| 7,390,686 | B2 * | 6/2008 | Lim ............................. 438/57 |
| 2006/0014314 | A1 | 1/2006 | Yaung et al. |
| 2007/0052053 | A1 | 3/2007 | Lee |

FOREIGN PATENT DOCUMENTS

JP 2003332544 11/2003

\* cited by examiner

*Primary Examiner*—Kevin M Picardat
(74) *Attorney, Agent, or Firm*—Saliwanchik, Lloyd & Saliwanchik

(57) ABSTRACT

A CIS and a method for manufacturing the same are provided. The CIS includes an interlayer insulation layer formed on a substrate having a photodiode and a transistor formed thereon; a plurality of color filters formed on the interlayer insulation layer and spaced a predetermined interval apart from each other; a metal sidewall formed to fill the predetermined interval between the plurality of the color filters; and a microlens formed on each of the plurality of color filters.

8 Claims, 5 Drawing Sheets

CMOS IMAGE SENSOR AND METHOD FOR MANUFACTURING THE SAME

CROSS-REFERENCE TO RELATED APPLICATIONS

This application is a divisional of U.S. application Ser. No. 11/528,077, filed Sep. 26, 2006 now U.S. Pat. No. 7,488,616, which claims the benefit under 35 U.S.C. §119 of Korean Patent Application No. 10-2005-0090265, filed Sep. 28, 2005, which are hereby incorporated by reference in their entirety.

FIELD OF THE INVENTION

The present invention relates to a CMOS image sensor and a method for manufacturing the same.

BACKGROUND OF THE INVENTION

In general, an image sensor is a semiconductor device that converts an optical image into an electrical signal. The image sensors are generally classified into charge coupled devices (CCDs) and complementary metal oxide silicon (CMOS) image sensors (CISs).

The CIS includes a photodiode for sensing an irradiated light and a CMOS logic circuit for processing the sensed light into an electric signal for data. As the amount of light in the photodiode increases, the photosensitivity of the image sensor improves.

To increase the photosensitivity, one technique is to increase a fill factor (a ratio of a photodiode area to an entire area of the image sensor). Another is a technique in which the path of light incident into a region other than a photodiode is changed to focus the light on the photodiode.

A typical example of the focusing technology includes a microlens formation. In the microlens formation, a convex microlens is formed of an excellent light transmission material on the photodiode such that more incident light can be directed onto the photodiode region by refracting the incident light.

In this case, the light parallel to an optical axis of the microlens is refracted through the microlens, and thus the focus of the microlens is formed at a predetermined position of the optical axis.

Typically, a CIS is classified according to the number of the transistors in a pixel. For example, the CIS can be classified as a 3T, 4T, or 5T type. The 3T includes one photodiode and three transistors. The 4T includes one photodiode and four transistors.

Hereinafter, a related art CIS will be described with reference to FIG. 1.

FIG. 1 is a sectional view of the related art CIS.

As illustrated in FIG. 1, a photodiode 12, an interlayer insulation layer 13, and a color filter layer 14, and a planarization layer 15 are sequentially formed on a substrate 11. Then, a microlens 16 is formed on the planarization layer 15.

However, the related art CIS has following problems.

For example, as illustrated in FIG. 1, incident light in tilt, which is not parallel to an optical axis of the microlens, included in light incident into the color filter 14 through the microlens 16 is induced into the photodiode 12 of another pixel and not the photodiode corresponding to the color filter. Thus, crosstalk occurs such that light becomes mixed and light sensitivity decreases.

SUMMARY OF THE INVENTION

Accordingly, the present invention is directed to a CIS and a method for manufacturing the same that addresses and/or substantially obviates one or more problems, limitations, and/or disadvantages of the related art.

An object of the present invention is to provide a CIS without crosstalk caused by light incident to a color filter through a microlens that is incident to an irrelevant photodiode and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CIS including: an interlayer insulation layer formed on a substrate having a photodiode and a transistor formed thereon; a plurality of color filters formed on the interlayer insulation layer and spaced a predetermined interval apart from each other; a metal sidewall formed to fill the predetermined interval between the plurality of the color filters; and a microlens formed on each of the plurality of color filters.

In another aspect of the present invention, there is provided an CIS including: an interlayer insulation layer formed on a substrate having a photodiode and a transistor formed thereon; a first color filter formed on the interlayer insulation layer; metal sidewalls formed on both side surfaces of the first color filter; a second color filter formed at one side of the first color filter with the metal sidewall interposed therebetween; a third color filter formed at another side of the first color filter with the metal sidewall interposed therebetween; and microlenses formed on the first, second, and third color filters.

In a further another aspect of the present invention, there is provided a method for manufacturing a CIS, the method including: forming an interlayer insulation layer on a substrate having a photodiode and a transistor; forming a first color filter on the interlayer insulation layer; forming metal sidewalls on both sides of the first color filter; forming a second color filter on one side of the first color filter with the metal sidewall interposed between the first color filter and the second color filter; forming a third color filter on the other side of the first color filter with the metal sidewall interposed between the first color filter and the third color filter; and forming a microlens on each of the first, second and third color filters.

In a still further another aspect of the present invention, there is provided a method for manufacturing a CIS, the method including: forming an interlayer insulation layer on a substrate having a photodiode and a transistor; forming green, red, and blue color filters on the interlayer insulation layer, the green, red, and blue color filters being spaced a predetermined interval apart from each other; forming metal sidewalls on the sides of each of the green, red, and blue color filters; forming a microlens on each of the green, red, and blue color filters.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
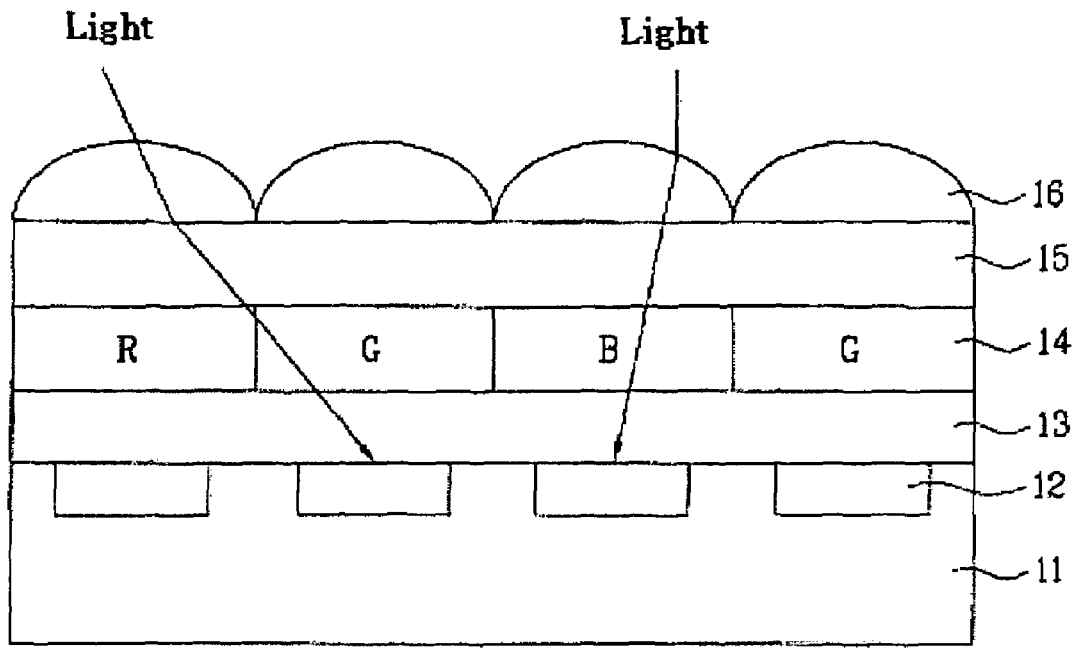
FIG. 1 is a sectional view of a related art CIS.
Figure 2:
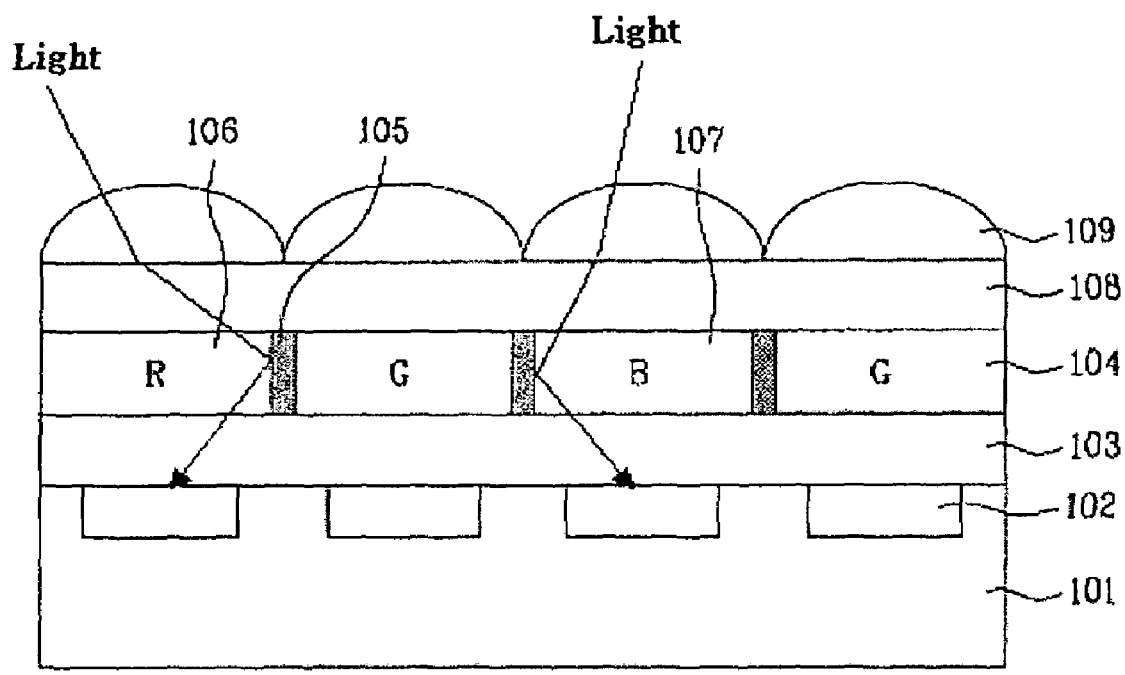
FIG. 2 is a sectional view of a CIS according to an embodiment of the present invention.

FIG. 2 is a sectional view of a CIS according to an embodiment of the present invention.

As illustrated in FIG. 2, a photodiode 102, which is part of a unit pixel in the CIS, and various transistors (not shown) can be formed on a semiconductor substrate 101. An interlayer insulation layer 103 can be formed on an entire surface of the semiconductor substrate 101. Then, a color filter layer can be formed on the interlayer insulation layer 103. The color filter layer can include a green color filter 104, a red color filter 106, and a blue color filter 107 that are spaced a predetermined interval apart from each other.

A metal sidewall 105 is formed between the color filters 104, 106, and 107.

In an embodiment, the metal sidewall 105 may be formed on both sides of the green color filter 103. That is, since the green color filter 104 shares contact points with other color filters 106 and 107, the metal sidewall 105 is formed between the color filters 104, 106, and 107 when the metal sidewall 105 is formed on both sides of the green filter 104.

In one embodiment, the metal sidewall 105 can be formed of opaque metal. In a specific embodiment, the metal sidewall 105 can be formed to a thickness of 500 to 2000 Å. Thus, light in tilt can be effectively total-reflected. When the thickness of the metal sidewall 105 is less than 500 Å, it may be difficult to perform a total reflection of light. When the metal sidewall 105 is more than 2000 Å, it may be difficult to collect light because the area that the color filters occupy decreases due to the increasing area occupied by the metal sidewall.

In one embodiment, the opaque metal may be one selected from the group consisting of Al, Cr, Mo, and Ti. When the opaque metal is formed to a thickness of 1000 Å, light in tilt can be effectively total-reflected.

That is, since the metal sidewall 105 is formed of an opaque metal layer between the color filters 104, 106, and 107, the light incident into the photodiode 102 through a microlens 109 is total-reflected. Therefore, the sensitivity of the image sensor increases by preventing crosstalk when the incident light in tilt is projected.

A planarization layer 108 can be formed on an entire surface of the semiconductor substrate 101 having the color filters 104, 106, and 107. The microlenses 109 can be formed corresponding to each of the color filters 104, 106, 107.

Hereinafter, a method for manufacturing a CIS will be described according to a first embodiment of the present invention.

FIGS. 3 to 7 are sectional views illustrating a method for manufacturing a CIS according to the first embodiment of the present invention.

Figure 3:
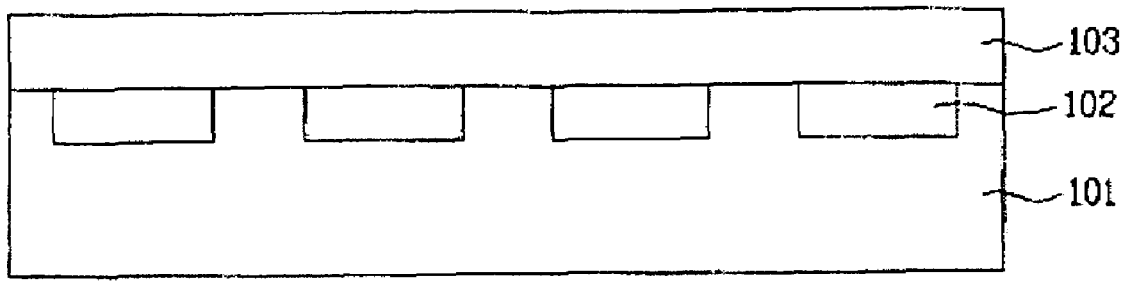
FIGS. 3 to 7 are sectional views illustrating a method for manufacturing a CIS according to a first embodiment of the present invention.

As illustrated in FIG. 3, a photodiode 102 and various transistors (not shown) can be formed on a semiconductor substrate 101 to constitute a unit pixel of the CIS.

Next, an interlayer insulation layer 103 can be formed on the semiconductor substrate 101 having the photodiode 102.

In an embodiment, the interlayer insulation layer 103 can be formed in a multi-layer structure. In a specific embodiment, after forming one interlayer insulation layer, a light blocking layer (not shown) can be formed for preventing light from being incident into the photodiode 102, and then another interlayer insulation layer can be formed thereon.

In one embodiment, the interlayer insulation layer 103 can be formed of an oxide such as an undoped silicate glass (USG).

Figure 4:
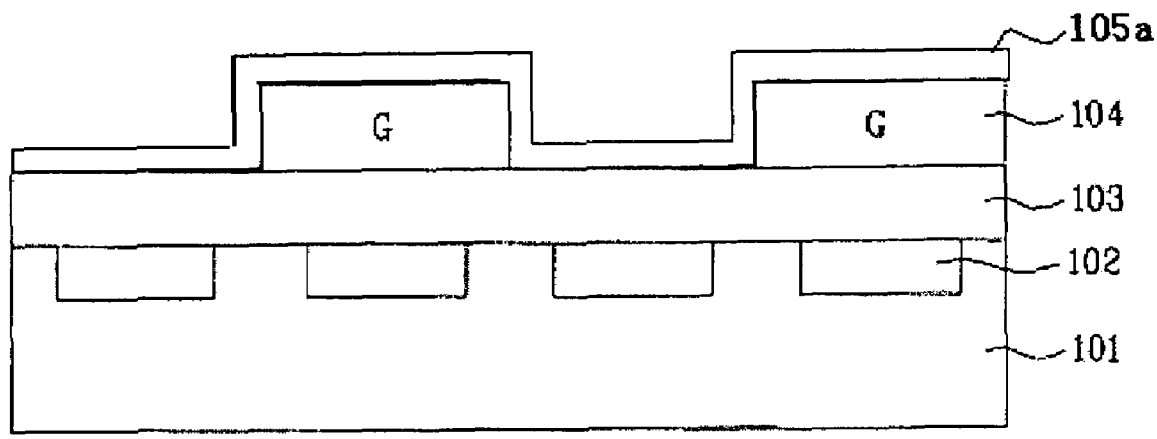

Next, as illustrated in FIG. 4, a green photosensitive material can be applied on the interlayer insulation layer 103, and then selectively patterned to form green color filters 104 spaced apart a predetermined interval.

Next, an opaque metal layer 105a (e.g., Al, Cr, Mo, Ti, etc.) can be formed on an entire surface of the semiconductor substrate 101 having the green color filter 104 to a thickness of 500 to 2000 Å.

Figure 5:
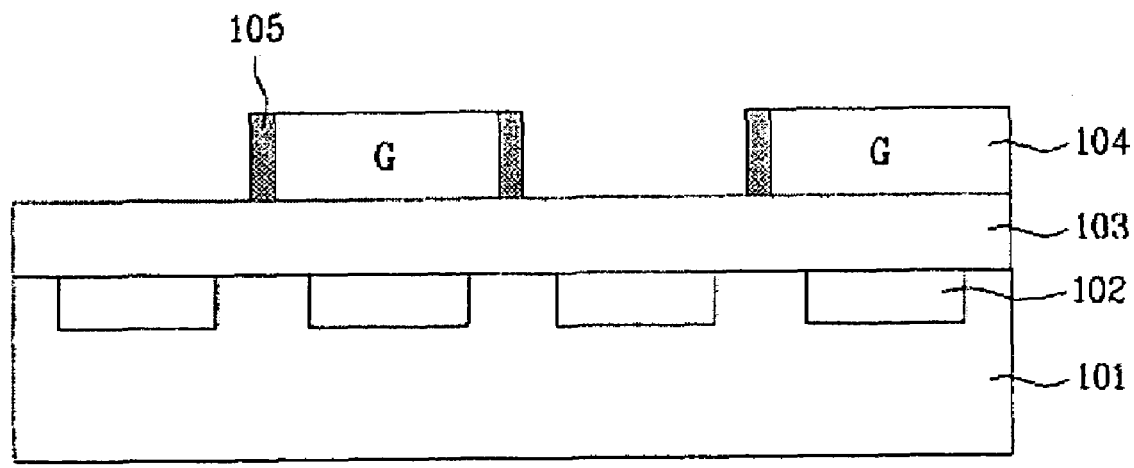

Next, as illustrated in FIG. 5, a blanket etch process can be performed on the opaque metal layer 105a to form metal sidewalls 105 on both sides of the green color filters 104.

That is, the metal sidewalls 105 can be formed on both sides of the green color filter 104. Accordingly, because the green color filter 104 shares contact points with other color filters 106 and 107, the metal sidewalls 105 are formed between the color filters 104, 106, and 107 when the metal sidewalls 105 are formed on both sides of the green filter 104.

Although the metal sidewall 105 is formed on both sides of the green color filter 104 in the first embodiment described above, the present invention is not limited to this.

Figure 6:
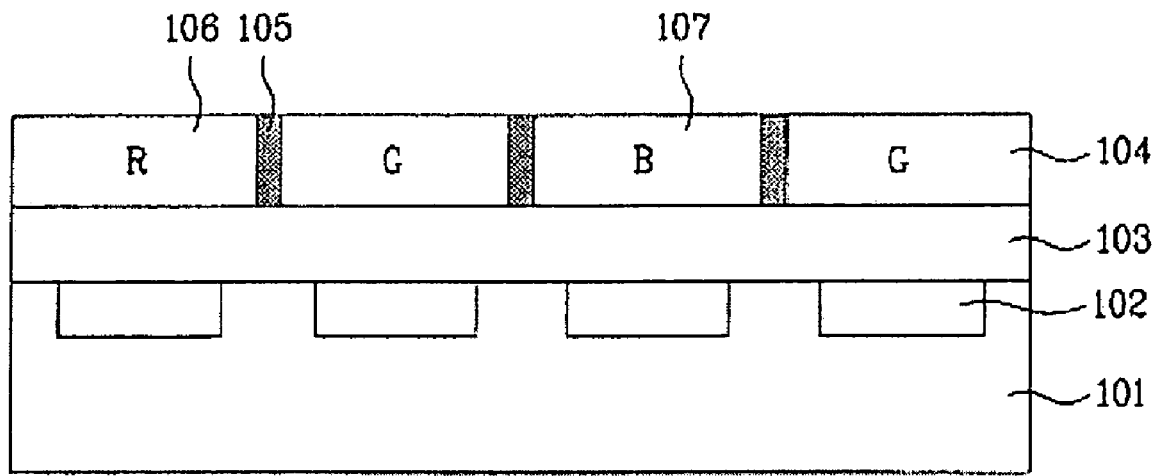

As illustrated in FIG. 6, after a red photosensitive material is applied to an entire surface of the semiconductor substrate 101 having the metal sidewall 105 and green color filter 104, it can be selectively patterned to form a red color filter 106 on a side of a green color filter 104.

Next, a blue photosensitive material can be applied to an entire surface of the semiconductor substrate 101. The blue photosensitive material can be selectively patterned using a photo and exposure process to form a blue color filter 107 on another side of the green color filter 104.

Figure 7:
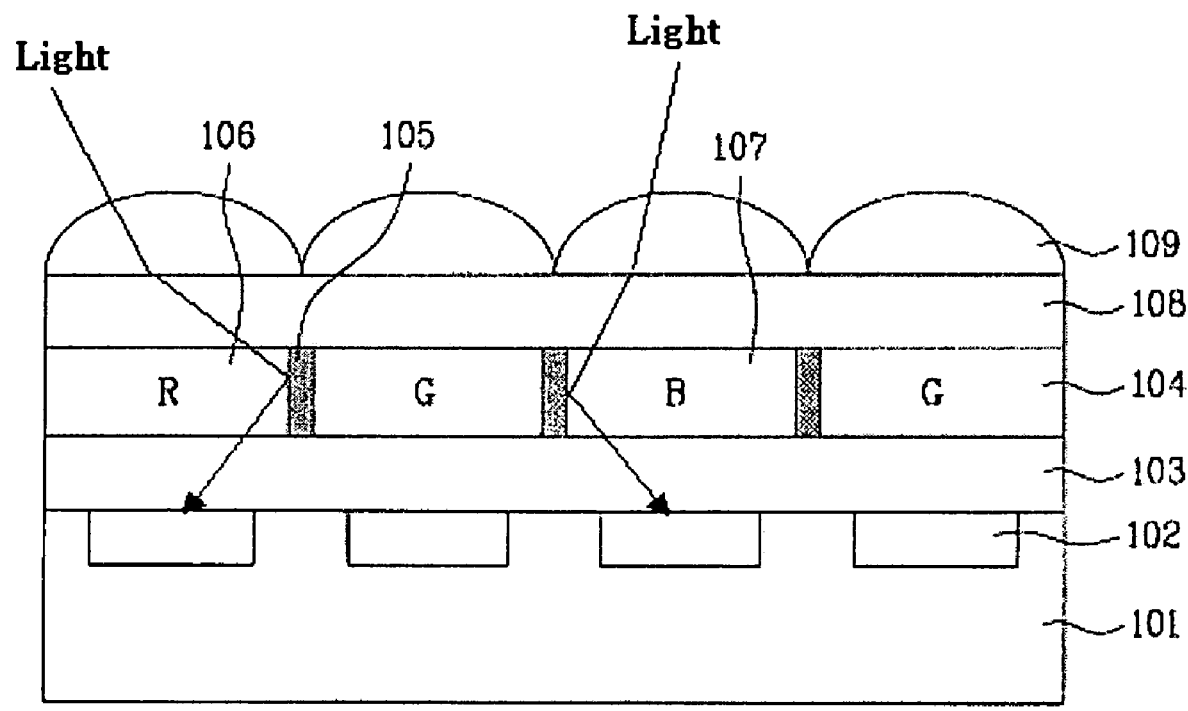

Next, as illustrated in FIG. 7, a planarization layer 108 can be formed on an entire surface of the semiconductor substrate 101 having the color filters 104, 106, and 107.

Next, a microlens material layer can be applied on the planarization layer 108, and then selectively patterned and reflowed to form a hemispherical microlens 109 to correspond to each of the color filters 104, 106, and 107.

In embodiments, an insulation layer such as an oxide layer or a photoresist may be used for the microlens material layer.

Additionally, the reflow process can use a hot plate or furnace. According to a contracting and heating method, the microlenses can have a different curvature. Concentration efficiency varies according to the curvature.

Next, ultraviolet rays can be irradiated on the microlens 109 for hardening. In one embodiment, a laser can be used to harden the microlens 109. Since the microlens 109 is hardened, it maintains an optimal radius for curvature.

Although a planarization layer 108 is formed in the embodiments described above, microlenses 109 may be directly formed on each of the color filters 104, 106, and 107 without forming the planarization layer 108.

In the method for manufacturing the CIS according to the first embodiment of the present invention, since the metal sidewall 105 of an opaque metal layer is formed between the color filters 104, 106, and 107, the light incident into the photodiode 102 through the microlens 109 is total-reflected. Therefore, the sensitivity of the image sensor increases by preventing crosstalk from incident light in tilt.

A method for manufacturing a CIS according to a second embodiment of the present invention will be described.

The method for the second embodiment may incorporate elements of the method for the first embodiment described in various embodiments above.

Characteristics of the method of the second embodiment are as follows.

In the first embodiment, after forming the green color filter 104, metal sidewalls 105 can be formed on both sides of the green color filter 104.

Figure 8:
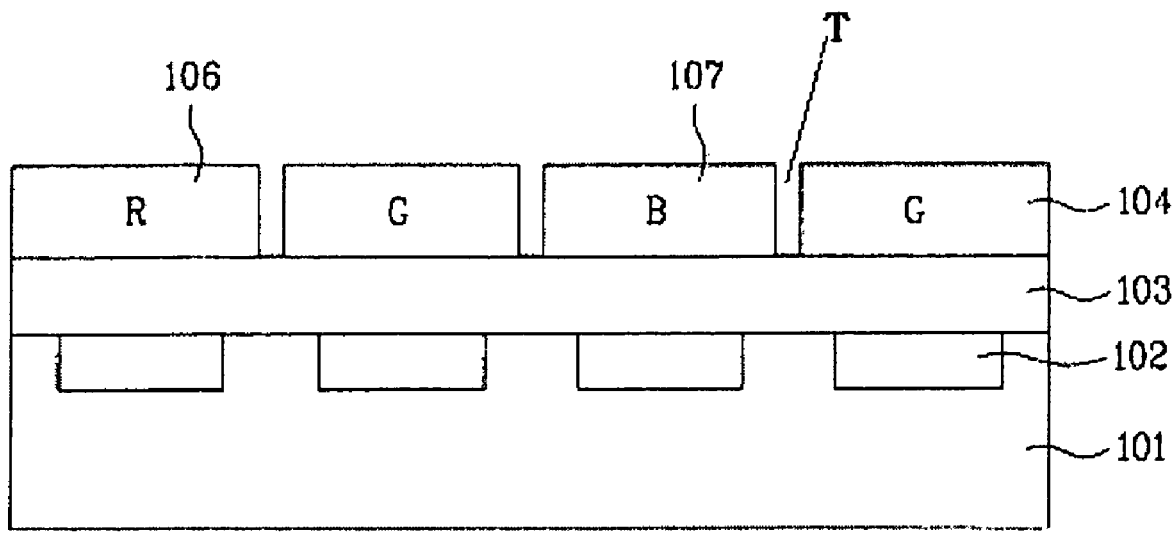
FIGS. 8 to 10 are sectional views illustrating a method for manufacturing a CIS according to a second embodiment of the present invention.

In contrast, in the second embodiment, as illustrated in FIG. 8, the color filters 104, 106, and 107 can first be formed in a predetermined interval T from each other.

Figure 9:
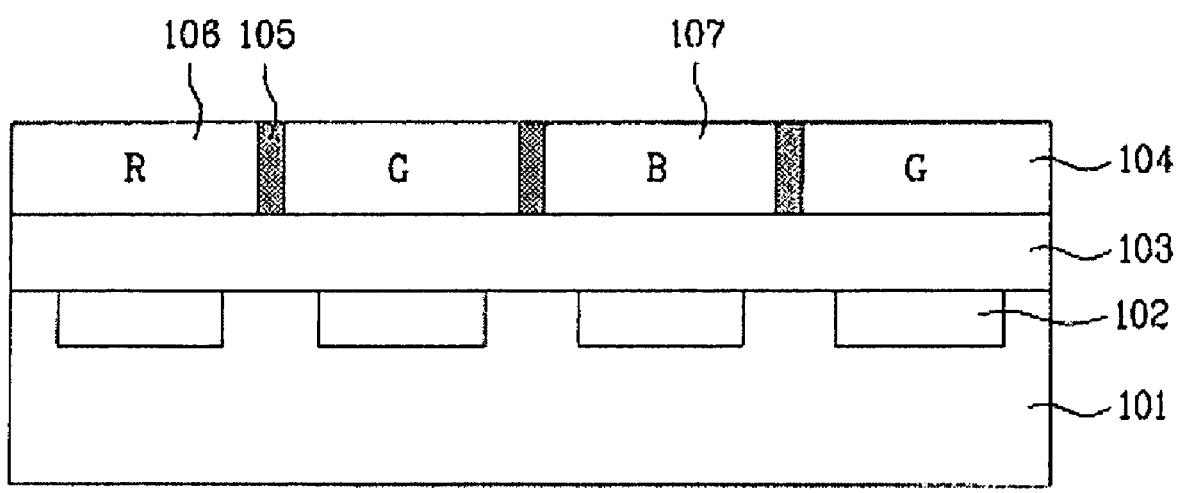

Then, as illustrated in FIG. 9, a metal layer can be deposited on the semiconductor substrate 101 having the color filters 104, 106, and 107 to fill the predetermined interval T. Then, a blanket etch or chemical mechanical polishing (CMP) process can be performed to form a metal sidewall 105 between the color filters 104, 106, and 107.

Figure 10:
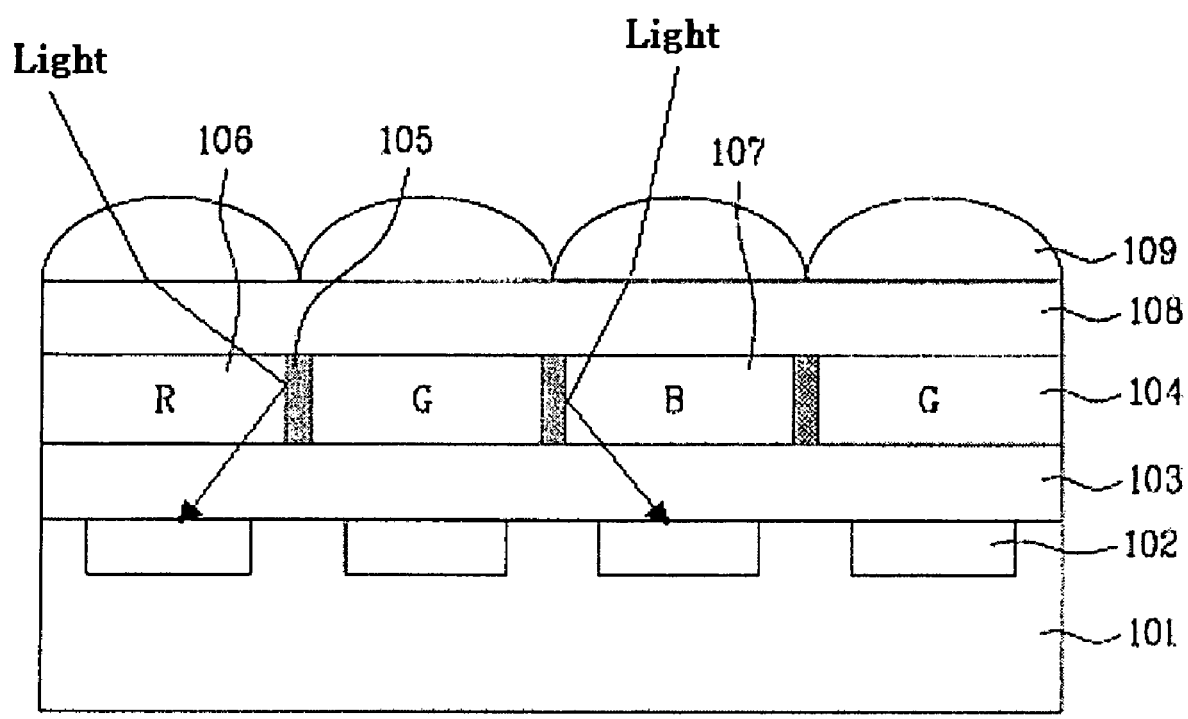

Next, as illustrated in FIG. 10, a planarization layer 108 and a microlens 109 can be sequentially formed on the color filters 104, 106, and 107 having the interposed metal sidewall 105.

In the method for the second embodiment, since the metal sidewall 105 of an opaque metal layer is formed between the color filters 104, 106, and 107, the light incident into the photodiode through a microlens is total-reflected. Therefore, the sensitivity of the image sensor increases by preventing crosstalk due to incident light in tilt.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CIS (complementary metal oxide silicon image sensor) comprising:
    an interlayer insulation layer formed on a substrate having a photodiode and a transistor formed thereon;
    a plurality of color filters formed on the interlayer insulation layer and spaced a predetermined interval apart from each other;
    a metal sidewall formed to fill the predetermined interval between the plurality of the color filters; and
    a microlens formed on each of the plurality of color filters.

2. The CIS according to claim 1, wherein the plurality of color filters comprise a red color filter, a green color filter, and a blue color filter.

3. The CIS according to claim 2, wherein the metal sidewall is formed on side surfaces of the green color filter.

4. The CIS according to claim 1, wherein the metal sidewall is formed of an opaque metal.

5. The CIS according to claim 4, wherein the opaque metal is one selected from the group consisting of Al, Cr, Mo, and Ti.

6. The CIS according to claim 1, further comprising a planarization layer on an entire upper surface of the substrate including the plurality of color filters.

7. A CIS (complementary metal oxide silicon image sensor) comprising:
    an interlayer insulation layer formed on a substrate having a photodiode and a transistor formed thereon;
    a first color filter formed on the interlayer insulation layer;
    metal sidewalls formed on side surfaces of the first color filter;
    a second color filter formed at one side of the first color filter with the metal sidewall interposed between the first color filter and the second color filter;
    a third color filter formed on another side of the first color filter with the metal sidewall interposed between the first color filter and the third color filter; and
    microlenses formed on the first, second, and third color filters.

8. The CIS according to claim 7, wherein the first color filter is a green color filter.

* * * * *